United States Patent
Kim et al.

(10) Patent No.: US 9,448,874 B2
(45) Date of Patent: Sep. 20, 2016

(54) APPARATUS AND METHOD FOR PREVENTING ERROR IN PHYSICALLY UNCLONABLE FUNCTION

(71) Applicant: ELECTRONICS AND TELECOMMUNICATIONS RESEARCH INSTITUTE, Daejeon (KR)

(72) Inventors: Moon-Seok Kim, Daejeon (KR); Sang-Kyung Yoo, Daejeon (KR); Seok Ryu, Daejeon (KR); Bong Soo Lee, Daejeon (KR); Rae Lee, Daejeon (KR); Junki Kang, Daejeon (KR); Sanghan Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 10 days.

(21) Appl. No.: 14/714,310

(22) Filed: May 17, 2015

(65) Prior Publication Data

US 2015/0347216 A1 Dec. 3, 2015

(30) Foreign Application Priority Data

Jun. 2, 2014 (KR) .................. 10-2014-0066709

(51) Int. Cl.
*H03M 13/00* (2006.01)
*G06F 11/07* (2006.01)
(Continued)

(52) U.S. Cl.
CPC ......... *G06F 11/079* (2013.01); *G06F 11/0745* (2013.01); *G06F 11/0751* (2013.01);
(Continued)

(58) Field of Classification Search
CPC ............. G06F 11/079; G06F 11/0745; G06F 11/0751; G06F 11/108; H04L 9/3278
See application file for complete search history.

(56) References Cited

U.S. PATENT DOCUMENTS

| 5,430,661 | A | 7/1995 | Fisher et al. |
| 7,681,103 | B2 * | 3/2010 | Devadas ................. G06F 21/31 714/752 |

(Continued)

FOREIGN PATENT DOCUMENTS

| JP | 2945139 B2 | 9/1999 |
| KR | 10-1994-0012127 A | 6/1994 |

(Continued)

OTHER PUBLICATIONS

S. Eiroa et al., "Reducing bit flipping problems in SRAM physical unclonable functions for chip identification," ICECS, 2012.

*Primary Examiner* — Esaw Abraham
(74) *Attorney, Agent, or Firm* — CRK Patent Law Firm

(57) ABSTRACT

An apparatus and method that prevent a bit error in a static random access memory (SRAM)-based Physically Unclonable function (PUF). The method for preventing an error in a PUF includes selecting any value, from a physically unclonable function based on a volatile memory device, as an input value, and checking a response corresponding to the selected input value, classifying cells having a plurality of bits corresponding to the response depending on frequency of error occurrence, calculating a number of white cells, in which an error does not occur, from classified results, and determining whether the number of white cells is greater than a preset threshold number of white cells, and selecting an input value of the physically unclonable function based on results of determination.

10 Claims, 3 Drawing Sheets

(51) Int. Cl.
  *G11C 29/52* (2006.01)
  *G11C 29/56* (2006.01)
  *G11C 11/41* (2006.01)
  *G11C 29/08* (2006.01)
  *G11C 29/44* (2006.01)
(52) U.S. Cl.
  CPC ......... *G11C29/52* (2013.01); *G11C 29/56008* (2013.01); *G11C 11/41* (2013.01); *G11C 29/08* (2013.01); *G11C 29/44* (2013.01)

(56) References Cited

U.S. PATENT DOCUMENTS

| | | | | |
|---|---|---|---|---|
| 7,840,803 B2 * | 11/2010 | Clarke | ................... | G06F 21/31 257/E23.179 |
| 8,510,608 B2 * | 8/2013 | Futa | ..................... | H03K 3/0315 708/251 |
| 8,750,502 B2 * | 6/2014 | Kirkpatrick | ........... | H04L 9/0866 380/44 |
| 8,848,477 B2 * | 9/2014 | Schrijen | .................. | G06F 7/588 365/185.04 |
| 8,928,347 B2 * | 1/2015 | Gotze | .................. | H03K 19/003 326/8 |
| 8,938,792 B2 * | 1/2015 | Koeberl | .................. | G06F 21/70 713/175 |
| 9,279,850 B1 * | 3/2016 | Pedersen | .............. | H03K 19/003 |

FOREIGN PATENT DOCUMENTS

| | | |
|---|---|---|
| KR | 10-2014-0059485 A | 5/2014 |
| KR | 10-1393806 B1 | 5/2014 |

* cited by examiner

APPARATUS AND METHOD FOR PREVENTING ERROR IN PHYSICALLY UNCLONABLE FUNCTION

CROSS REFERENCE TO RELATED APPLICATION

This application claims the benefit of Korean Patent Application No. 10-2014-0066709 filed Jun. 2, 2014, which is hereby incorporated by reference in its entirety into this application.

BACKGROUND OF THE INVENTION

1. Technical Field

The present invention generally relates to an apparatus and method for preventing an error in a physically unclonable function (PUF) and, more particularly, to an apparatus and method that prevent a bit error in a static random access memory (SRAM)-based PUF.

2. Description of the Related Art

Generally, even if a manufacturing process is performed in the same semiconductor process conditions, variations in physical or electrical parameters unpredictably occur in each device.

A physically unclonable function (also referred to as a "PUF") may be applied to devices that yield unpredictable results. In this way, a device to which a physically unclonable function, that is, a PUF, is applied may be used for a device authentication function, a forgery prevention function, etc., as in the case of Korean Patent Application Publication No 10-2014-0059485 entitled "Device Authentication Apparatus and Method using physically unclonable function").

Recently, among PUFs, an SRAM-based PUF having unpredictability and excellent characteristics from the standpoint of entropy has attracted considerable attention. However, even an SRAM-based PUF is disadvantageous in that robustness thereof is not perfect. To solve this problem, robustness has been improved by connecting an error correction coding PUF to an existing PUF.

An SRAM PUF has a bit error rate of about 6%, so that an error correction code having a high error correction rate must be used. Further, an error correction code having a high error correction rate has a large overhead regardless of whether it is implemented using hardware or software.

Therefore, technology for preventing a bit error in an SRAM-based PUF is required.

SUMMARY OF THE INVENTION

Accordingly, the present invention has been made keeping in mind the above problems occurring in the prior art, and an object of the present invention is to provide an apparatus and method that prevent a bit error in an SRAM-based physically unclonable function (PUF).

In accordance with an aspect of the present invention to accomplish the above object, there is provided a method for preventing an error in a physically unclonable function (PUF), including selecting any value, from a physically unclonable function based on a volatile memory device, as an input value, and checking a response corresponding to the selected input value; classifying cells having a plurality of bits corresponding to the response depending on frequency of error occurrence; calculating a number of white cells, in which an error does not occur, from classified results; and determining whether the number of white cells is greater than a preset threshold number of white cells, and selecting an input value of the physically unclonable function based on results of determination.

Checking the response may include selecting any value corresponding to a memory address of the volatile memory device as the input value, and checking data at the memory address as a response.

Checking the response may include selecting, as the input value, any value that can be obtained either by generating a random number or using a response of another physically unclonable function.

Classifying the cells may include checking a frequency of error occurrence based on variations in logical values of the cells after power to the cells has been shut off/applied, and classifying the cells based on results of checking the frequency of error occurrence.

Classifying the cells may include classifying the cells into white cells in which an error does not occur, black cells in which an error continuously occurs, and gray cells having an error occurrence frequency corresponding to an intermediate level of error occurrence frequencies of the white cells and the black cells.

In accordance with another aspect of the present invention to accomplish the above object, there is provided an apparatus for preventing an error in a physically unclonable function, including a checking unit for selecting any value, from a physically unclonable function based on a volatile memory device, as an input value, and checking a response corresponding to the selected input value; a cell classification unit for classifying cells having a plurality of bits corresponding to the response depending on frequency of error occurrence; a calculation unit for calculating a number of white cells, in which an error does not occur, from classified results; and a selection unit for determining whether the number of white cells is greater than a preset threshold number of white cells, and selecting an input value of the physically unclonable function based on results of determination.

The checking unit may be configured to select any value corresponding to a memory address of the volatile memory device as the input value, and check data at the memory address as a response.

The checking unit may be configured to select, as the input value, any value that can be obtained either by generating a random number or using a response of another physically unclonable function.

The classification unit may be configured to check a frequency of error occurrence based on variations in logical values of the cells after power to the cells has been shut off/applied, and classify the cells based on results of checking the frequency of error occurrence.

The classification unit may be configured to classify the cells into white cells in which an error does not occur, black cells in which an error continuously occurs, and gray cells having an error occurrence frequency corresponding to an intermediate level of error occurrence frequencies of the white cells and the black cells.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
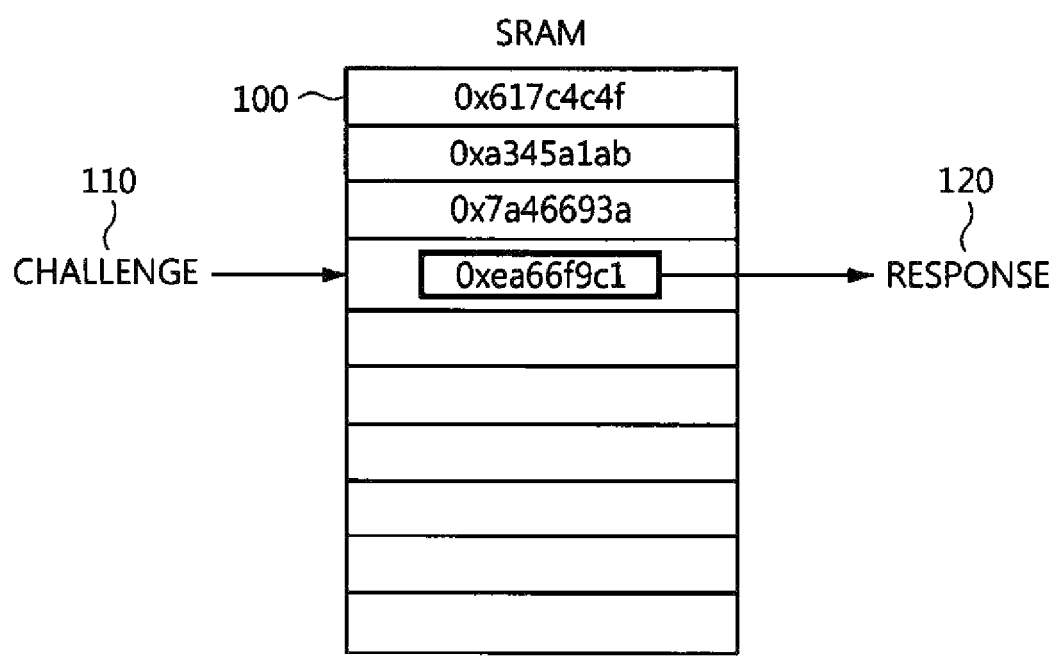
FIG. 1 is a diagram showing the input and output of an SRAM-based PUF according to an embodiment of the present invention.

The present invention will be described in detail below with reference to the accompanying drawings. Repeated descriptions and descriptions of known functions and configurations that have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

Hereinafter, an apparatus and method for preventing an error in a static random access memory (SRAM)-based physically unclonable function (PUF) according to embodiments of the present invention will be described in detail with reference to the attached drawings.

FIG. 1 is a diagram showing the input and output of an SRAM-based PUF according to an embodiment of the present invention.

Referring to FIG. 1, an SRAM 100 is a volatile memory device for storing data at high read/write speeds.

Generally, if the power of the SRAM 100 is supplied after being shut off for a predetermined period of time, and the SRAM 100 is not initialized, unpredictable data may be read. Such a data value may be applied to a physically unclonable function (hereinafter also referred to as a "PUF").

When the SRAM 100-based PUF uses, for example, a memory address, as an input value (challenge) 110, it outputs data at the memory address as a response 120. Here, the robustness of the SRAM 100-based PUF means that the response 120 for the same input value 110 is output as the same response even after the power has been shut off/applied.

The robustness of the SRAM-based PUF exhibits a bit error rate of about 6% without being perfect. In this case, a bit error occurs in SRAM hardware cells. An error in the SRAM-based PUF occurs such that cells occupying 4% of all cells continuously cause errors.

An apparatus for preventing an error in a PUF (or a PUF error) according to an embodiment of the present invention may classify SRAM cells based on the frequency of occurrence of errors in the SRAM cells. Here, SRAM cells may be classified into white cells, gray cells, and black cells.

The white cells denote cells in which an error does not occur, the black cells denote cells in which an error continuously occurs, and gray cells denote cells which have an error occurrence frequency corresponding to an intermediate level of the error occurrence frequencies of the white cells and the black cells. Here, the distributions of white cells, gray cells, and black cells according to the embodiment of the present invention is characterized by having a random shape without having a burst shape, but the shape of distributions is not limited thereto.

Below, the apparatus for preventing an error in a PUF (or a PUF error) will be described in detail with reference to FIG. 2.

Figure 2:
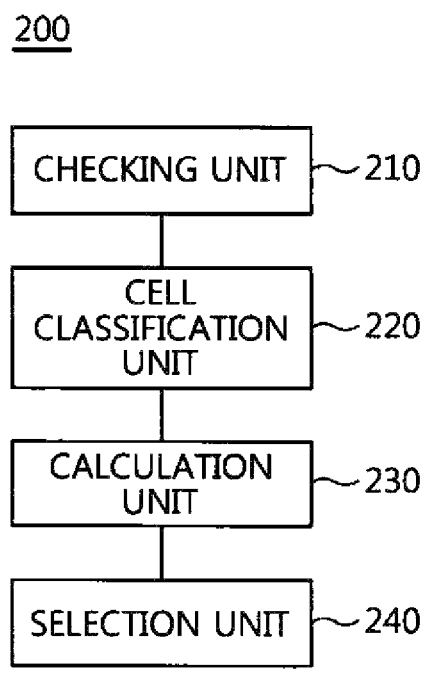
FIG. 2 is a configuration diagram schematically showing an apparatus for preventing a PUF error according to an embodiment of the present invention.

FIG. 2 is a configuration diagram schematically showing an apparatus for preventing a PUF error according to an embodiment of the present invention.

First, an apparatus 200 for preventing a PUF error according to an embodiment of the present invention is characterized in that an error is prevented when an error distribution of SRAM PUF cells is concentrated only on a specific cell and exhibits random characteristics, but is not limited thereto.

Further, when a memory address, for example, is set to an input value (challenge) 110, an SRAM 100-based PUF outputs data at the memory address as a response 120. Here, the memory address has 1-word (32-bit) data. That is, it may be assumed that the input value of the SRAM 100 has a 32-bit response, but is not limited thereto.

Referring to FIG. 2, the apparatus 200 for preventing a PUF error includes a checking unit 210, a cell classification unit 220, a calculation unit 230, and a selection unit 240.

The checking unit 210 selects any value as an input value, and checks an SRAM response corresponding to the input value. Here, any value corresponds to a random value that can be acquired either by generating a random number or using another PUF response.

The cell classification unit 220 classifies results of checking by the checking unit 210, that is, 32-bit cells, into white cells, gray cells, and black cells, depending on the frequency of error occurrence.

More specifically, the cell classification unit 220 checks the frequency of error occurrence based on variations in the logical values of cells after power to SRAM cells has been shut off/applied, and classifies the cells based on the checked error occurrence frequency.

For example, after power to the corresponding cell has been shut off/applied 18 times, when an SRAM response of "1" is checked 9 times and an SRAM response of "0" is checked 9 times, the corresponding cell is classified as a black cell. In contrast, after power to the corresponding cell has been shut off/applied 18 times, when an SRAM response of "1" or "0" is checked 18 times, the corresponding cell is classified as a white cell.

After cells have been classified by the cell classification unit 220, the calculation unit 230 calculates the number of white cells N among the SRAM cells.

The selection unit 240 determines whether the number of white cells N calculated by the calculation unit 230 is greater than the preset threshold number $N_{TH}$ of white cells, and selects the corresponding input value, that is, the input value of a PUF, based on the results of determination.

More specifically, when the number of white cells calculated by the calculation unit 230 is greater than the threshold number $N_{TH}$ of white cells, the selection unit 240 regards the corresponding input value as a good input (good challenge), and selects the input value. In this case, a tradeoff caused by the setting of the threshold number $N_{TH}$ of white cells may be present. As the threshold number $N_{TH}$ of white cells is larger, the probability of occurrence of errors is decreased, but the number of input values satisfying the required condition is decreased, and thus more data of SRAM is required. In contrast, when the threshold number $N_{TH}$ of white cells is smaller, the number of input values satisfying the required condition is increased, but the probability of occurrence of errors is increased.

In this way, the apparatus for preventing a PUF error according to an embodiment of the present invention may perform, but is not limited thereto, the same procedure as a procedure of searching all cells of the SRAM for an input value at which an error does not occur. For example, when data is required in a 1024-bit SRAM-based PUF, the present invention may select 32 good challenges and operate the SRAM-based PUF in which an error does not occur.

Below, a method for preventing a PUF error will be described in detail with reference to FIG. 3.

Figure 3:
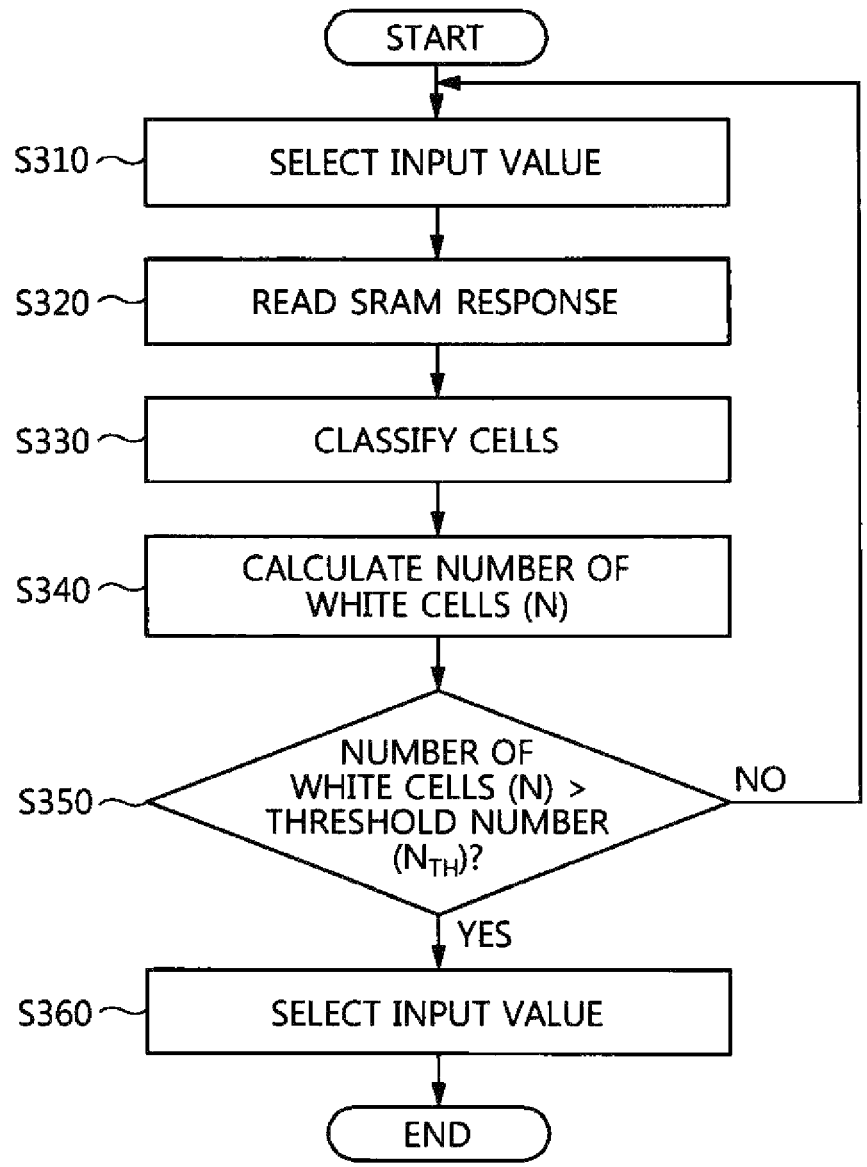
FIG. 3 is a flowchart showing a method for preventing an error in a PUF according to an embodiment of the present invention.

FIG. 3 is a flowchart showing a method for preventing a PUF error according to an embodiment of the present invention.

Referring to FIG. 3, the apparatus for preventing a PUF error in a PUF selects any value as an input value at step S310. Here, any value corresponds to any random number that may be acquired either by generating a certain random number or using another PUF response.

The apparatus for preventing a PUF error reads and checks an SRAM response corresponding to the input value, selected at S310, at step S320.

The apparatus for preventing a PUF error classifies 32-bit cells corresponding to the SRAM response into white cells, gray cells, and black cells depending on the frequency of error occurrence at step S330.

More specifically, the apparatus for preventing a PUF error checks the frequency of error occurrence based on variations in logical values of cells after power to the SRAM cells has been shut off/applied, and classifies the cells depending on the frequency of error occurrence. Here, the SRAM cells may be classified into white cells, gray cells, and black cells.

The white cells denote cells in which an error does not occur, black cells denote cells in which an error continuously occurs, and gray cells denote cells which have an error occurrence frequency corresponding to an intermediate level of the error occurrence frequencies of the white cells and the black cells. Here, distributions of white cells, gray cells, and black cells according to an embodiment of the present invention are characterized by having a random shape without having a burst shape, but the shape of distributions is not limited thereto.

After classification at step S330, the apparatus for preventing a PUF error calculates the number of white cells N among the SRAM cells at step S340.

The apparatus for preventing a PUF error determines whether the number of white cells N calculated at step S340 is greater than the preset threshold number of white cells $N_{TH}$ at step S350, and selects the corresponding input value based on the results of determination at step S360.

If the number of white cells N calculated at step S340 is greater than the preset threshold number of white cells $N_{TH}$, the apparatus for preventing a PUF error regards the corresponding input value as a good challenge, and selects the input value. Here, a tradeoff caused by the setting of the threshold number of white cells $N_{TH}$ may be present. As the threshold number of white cells $N_{TH}$ is larger, the probability of error occurrence is decreased, but the number of input values satisfying the required condition is reduced, and thus more data of SRAM is required. In contrast, as the threshold number of white cells $N_{TH}$ is smaller, the number of input values satisfying the required condition is increased, but the probability of error occurrence is increased.

In this way, the present invention may also control the error rate of a PUF depending on the purpose of use of the PUF by adjusting the preset threshold number of white cells. Therefore, the present invention may implement an SRAM-based PUF having high robustness without requiring an error correction code.

The present invention enables a bit error rate of about 6% to converge on 0% via a procedure of preventing a bit error in an SRAM-based PUF.

Further, the present invention may also control the error rate of a PUF based on the purpose of use of the PUF by adjusting the preset threshold number of white cells. Therefore, the present invention may implement an SRAM-based PUF having high robustness without requiring an error correction code.

As described above, optimal embodiments of the present invention have been disclosed in the drawings and the specification. Although specific terms have been used in the present specification, these are merely intended to, describe the present invention and are not intended to limit the meanings thereof or the scope of the present invention described in the accompanying claims. Therefore, those skilled in the art will appreciate that various modifications and other equivalent embodiments are possible from the embodiments. Therefore, the technical scope of the present invention should be defined by the technical spirit of the claims.

What is claimed is:

1. A method for preventing an error in a physically unclonable function (PUF), comprising:
   selecting any value, from a physically unclonable function based on a volatile memory device, as an input value, and checking a response corresponding to the selected input value;
   classifying cells having a plurality of bits corresponding to the response depending on frequency of error occurrence;
   calculating a number of white cells, in which an error does not occur, from classified results; and
   determining whether the number of white cells is greater than a preset threshold number of white cells, and selecting an input value of the physically unclonable function based on results of determination.

2. The method of claim 1, wherein checking the response comprises selecting any value corresponding to a memory address of the volatile memory device as the input value, and checking data at the memory address as a response.

3. The method of claim 1, wherein checking the response comprises selecting, as the input value, any value that can be obtained either by generating a random number or using a response of another physically unclonable function.

4. The method of claim 1, wherein classifying the cells comprises checking a frequency of error occurrence based on variations in logical values of the cells after power to the cells has been shut off/applied, and classifying the cells based on results of checking the frequency of error occurrence.

5. The method of claim 1, wherein classifying the cells comprises classifying the cells into white cells in which an error does not occur, black cells in which an error continuously occurs, and gray cells having an error occurrence frequency corresponding to an intermediate level of error occurrence frequencies of the white cells and the black cells.

6. An apparatus for preventing an error in a physically unclonable function, comprising:
   a checking unit for selecting any value, from a physically unclonable function based on a volatile memory device, as an input value, and checking a response corresponding to the selected input value;
   a cell classification unit for classifying cells having a plurality of bits corresponding to the response depending on frequency of error occurrence;
   a calculation unit for calculating a number of white cells, in which an error does not occur, from classified results; and a selection unit for determining whether the number of white cells is greater than a preset threshold number of white cells, and selecting an input value of the physically unclonable function based on results of determination.

7. The apparatus of claim 6, wherein the checking unit is configured to select any value corresponding to a memory address of the volatile memory device as the input value, and check data at the memory address as a response.

8. The apparatus of claim 6, wherein the checking unit is configured to select, as the input value, any value that can be obtained either by generating a random number or using a response of another physically unclonable function.

9. The apparatus of claim 6, wherein the classification unit is configured to check a frequency of error occurrence based on variations in logical values of the cells after power to the cells has been shut off/applied, and classify the cells based on results of checking the frequency of error occurrence.

10. The apparatus of claim 6, wherein the classification unit is configured to classify the cells into white cells in which an error does not occur, black cells in which an error continuously occurs, and gray cells having an error occurrence frequency corresponding to an intermediate level of error occurrence frequencies of the white cells and the black cells.

\* \* \* \* \*